United States Patent
Jo et al.

(10) Patent No.: US 8,518,805 B2
(45) Date of Patent: Aug. 27, 2013

(54) METHOD FOR MANUFACTURING A SEMICONDUCTOR DIE AND A SEMICONDUCTOR DEVICE COMPRISING THE SEMICONDUCTOR DIE OBTAINED THEREBY

(75) Inventors: Kwang-Jae Jo, Seoul (KR); Kyung-Ho Jang, Gyeonggi-do (KR)

(73) Assignee: 3M Innovative Properties Company, Saint Paul, MN (US)

( * ) Notice: Subject to any disclaimer, the term of this patent is extended or adjusted under 35 U.S.C. 154(b) by 727 days.

(21) Appl. No.: 12/672,899

(22) PCT Filed: Aug. 21, 2008

(86) PCT No.: PCT/US2008/073797
§ 371 (c)(1),
(2), (4) Date: Feb. 10, 2010

(87) PCT Pub. No.: WO2009/032536
PCT Pub. Date: Mar. 12, 2009

(65) Prior Publication Data
US 2011/0175243 A1    Jul. 21, 2011

(30) Foreign Application Priority Data
Aug. 28, 2007 (KR) .................. 10-2007-0086787

(51) Int. Cl.
*H01L 21/301* (2006.01)
*H01L 21/46* (2006.01)
*H01L 21/78* (2006.01)

(52) U.S. Cl.
USPC ...... 438/465; 438/458; 438/460; 257/E21.599

(58) Field of Classification Search
USPC ........................................... 438/465
See application file for complete search history.

(56) References Cited

U.S. PATENT DOCUMENTS

| 2006/0124241 A1 | 6/2006 | Doi et al. |
| 2006/0246625 A1 | 11/2006 | Terui et al. |
| 2007/0102793 A1 | 5/2007 | Eun |

FOREIGN PATENT DOCUMENTS

| JP | 5-144938 | 6/1993 |
| JP | 2007-56134 | 3/2007 |
| WO | WO 2004/000966 | 12/2003 |

*Primary Examiner* — Thien F Tran

(57) ABSTRACT

Disclosed is a method for dicing a semiconductor wafer. The method for dicing a semiconductor wafer prevents a die from being contaminated with silicon dust, generated during the dicing of the wafer, and thus prevents defects in a subsequent wire bonding step, such as defects in bonding wire, contamination of a semiconductor device, etc. The method for dicing a semiconductor wafer comprises the steps of: applying a fluorine-containing polymer coating agent onto one surface of a wafer having a circuit pattern formed thereon to form a polymer coating layer, before dicing the wafer.

19 Claims, 5 Drawing Sheets

METHOD FOR MANUFACTURING A SEMICONDUCTOR DIE AND A SEMICONDUCTOR DEVICE COMPRISING THE SEMICONDUCTOR DIE OBTAINED THEREBY

CROSS REFERENCE TO RELATED APPLICATIONS

This application is a national stage filing under 35 U.S.C. §371 of PCT/US2008/073797, filed Aug. 21, 2008, which claims priority to Korean Application No. 10-2007-0086787, filed Aug. 28, 2007, the disclosure of which is incorporated by reference in its/their entirety herein.

TECHNICAL FIELD

The present disclosure relates to a method for manufacturing a semiconductor die. More particularly, the present disclosure relates to a method for manufacturing a semiconductor die comprising a step of dicing a semiconductor wafer, which prevents a semiconductor device from being contaminated by silicon dust substantially generated during the dicing of the wafer, and thus reduces and prevents defects in a subsequent wire bonding process, contaminations of a sensor surface, or surface damages caused by the silicon dust.

BACKGROUND

Recently, as personal information/communication terminals have been popularized, semiconductor devices have been developed increasingly as electronic components related to such terminals. Additionally, development for a method for manufacturing a more compact and precise semiconductor device has been accelerated.

The semiconductor device is also referred to as a "chip scale package," which is a "die" (a die having a circuit formed thereon, separated from a silicon wafer) packaged with an insulation material. In the present disclosure, a "die" means a "semiconductor die."

A general process for manufacturing a semiconductor device includes a step of fabricating a wafer, a step of processing the wafer and a step of packaging the wafer. If necessary, after a circuit pattern is formed on one surface 10a of the wafer by way of the wafer processing step, a grinding step may be performed in order to reduce the thickness of the semiconductor device. In the grinding step, the back surface 10b of the wafer 10, which has no circuit pattern, is removed by a grinder 20, as shown in FIG. 1a.

At this time, a tape 14 for back grinding is generally attached to the wafer surface 10a having the circuit pattern in order to protect the circuit pattern.

After the tape 14 for back grinding is removed from the top surface 10a of the wafer having the circuit pattern formed thereon, a dicing tape 15 is attached to the back surface 10b of the wafer 10. Then, as shown in FIGS. 1c and 1d, the wafer 10 is subjected to a dicing process for cutting the wafer, so that several hundreds of dies 13 can be obtained from one wafer 10.

Meanwhile, as shown in FIG. 1e, a strip line 19 is formed between a die and another die at a predetermined interval of about 100 µm when fabricating the wafer 10, so that the wafer is cut by a blade along the strip line 19 during the dicing process.

Additionally, during the dicing process for cutting the strip line 19, the blade 30 is selected according to the hardness, softness and wear resistance of the wafer 10 and characteristics of the semiconductor device. Further, the dicing tape 15 is attached to the wafer in order to prevent an individually separated die 13 from flying by the impact caused by the cutting work.

The aforementioned dicing tape 15 is removed from the back surface 10b of the wafer by irradiating UV rays thereto to cure the adhesive layer of the tape and to reduce the adhesion value of the tape. After removing the dicing tape 15, dies can be individually picked up and mounted onto a printed circuit board. Then, the die is connected electrically to the printed circuit board by way of wire bonding, and the resultant structure is packaged to provide a finished semiconductor device having desired characteristics.

However, as a thin and compact semiconductor device is required, the thickness of a wafer has increased. In addition, a diameter of a wafer has increased to increase the number of die or semiconductor device produced from the wafer for the cost savings in fabrication and improvement of the productivity. To this end, a thin and wide wafer has been used for the dicing process using a blade. However, such a wafer may be broken or cracked by the mechanical impact caused by the blade.

To solve the aforementioned problem, it has been suggested that cutting by a blade is performed at a lower rate but instead more deeply during the dicing process. However, in this case, an increased amount of silicon dust is generated on the cut surface of the wafer.

Such silicon dust 18 includes nickel, diamond dust, alloy and other residue generated from the blade. The silicon dust flies during the blade cutting process, and then sticks onto the bonding pad 11 of the die, as shown in FIG. 1f.

Meanwhile, it is inevitable that the bonding pad 11 of the die is designed to have a small area because I/O number should be increased in order to increase the integration degree of logic elements on a smaller die. Thus, if the silicon dust 18 sticks onto the die having a small area, it is difficult to ensure the bonding reliability in the subsequent wire bonding process.

For example, even when Au wires are bonded to a bonding pad formed of Al while the silicon dust 18 remains on the bonding pad having a small area, because intermetallic compound ($AuAl_2$) between two the metals is not formed efficiently, it is not possible to perform the bonding smoothly, resulting in degradation in the bonding strength and in an increase in the electric resistance. Therefore, when the resultant semiconductor device is subjected to temperature stress, bond wire opening may occur or the semiconductor device may be deteriorated.

To solve the aforementioned problem, it has been suggested that deionized (DI) water mixed with carbon dioxide ($CO_2$) gas is sprayed onto the wafer to remove the silicon dust from the wafer. However, in this case, the carbon dioxide gas added to increase the cleaning power may react with the metal of the bonding pad 11, resulting in corrosion of the bonding pad 11.

Also, such corrosion of the bonding pad degrades the wire bonding quality during the subsequent wire bonding process, resulting in degradation in the electrical reliability of the semiconductor device.

SUMMARY

Therefore, the present inventors have determined that it is necessary to provide a method for dicing a semiconductor wafer so as to prevent undesired residue such as silicon dust from remaining on the surface of a semiconductor die and to inhibit corrosion of the metal on the die.

The various embodiments of the present disclosure prevent surface contamination of a semiconductor die, caused by silicon dust generated during the dicing process of a wafer, and prevent surface damages caused by the silicon dust and/or defects in wire bonding.

The present disclosure also describe various approaches to inhibit corrosion of metals on the semiconductor die, caused by a gas mixture, such as a mixture of deionized water with carbon dioxide, used for cleaning of a semiconductor device.

According to an aspect of the present disclosure, there is provided a method for manufacturing a semiconductor die, which comprises the steps of: forming a fluorine-containing polymer coating layer on a surface of the semiconductor wafer; dicing the wafer; and removing the fluorine-containing polymer coating layer.

The fluorine-containing polymer coating layer can be formed by a fluorine-containing polymer coating agent, which contains a fluorine-containing polymer compound and solvent. This fluorine-containing polymer coating agent can be prepared by dispersing or dissolving a fluorine-containing polymer compound in a solvent.

For example, the fluorine-containing polymer compound may have the structure of a hydrocarbon-containing polymer, wherein hydrogen is substituted with fluorine. According to the embodiment of the present disclosure, the fluorine-containing polymer compound preferably has both a hydrophobic group and a hydrophilic group. The fluorine-containing polymer compound having both a hydrophobic group and a hydrophilic group may be a compound in which a main chain made of hydrocarbon or fluorine-containing hydrocarbon has oxygen or nitrogen, or a compound in which a branched chain has an acidic group. The acidic groups may be groups such as a carboxylic acid (—COOH) or a sulfonic acid (—$SO_3H$). The hydrocarbon or fluorine-containing hydrocarbon acts as a hydrophobic group, and the oxygen, nitrogen or acidic group acts as a hydrophilic group.

The solvent for the fluorine-containing polymer coating agent may be a fluorine-containing solvent in liquid state at room temperature. The solvent preferably has a molecular weight, which is adjustable to maintain the liquid state at room temperature. For example, such a fluorine-containing solvent may have about 100-800 molecular weight. This fluorine-containing solvent may be solvents such as a fluorine-substituted ether, a fluorine-substituted ester or a fluorine-substituted ketone.

Meanwhile, the fluorine-containing solvent, which can be used for preparing a fluorine-containing polymer coating agent, can also be used for removing a fluorine-containing polymer coating layer formed by the fluorine-containing polymer coating agent. To be specific, a decoating agent is used during the process for removing the fluorine-containing polymer coating layer. The fluorine-containing solvent can be used as the decoating agent. The fluorine-containing solvent used as a decoating agent may be the same as or different from a fluorine-containing solvent used for preparing the fluorine-containing polymer coating agent to form a fluorine-containing polymer coating layer, to which the decoating agent is applied. In other words, the fluorine-containing solvent, which is used as a decoating agent, does not need to be the same as the solvent, which is used when preparing the fluorine-containing polymer coating agent according to the present disclosure.

According to the method of the present disclosure to manufacture a semiconductor die, it is possible to prevent a surface of a semiconductor device from being contaminated with silicon dust by protecting the surface with the fluorine-containing coating agent.

BRIEF DESCRIPTION OF THE DRAWINGS

The foregoing and other objects, features and advantages of the present disclosure will become more apparent from the following detailed description when taken in conjunction with the accompanying drawings in which.

Reference will now be made in detail to the preferred embodiments of the present disclosure.

Generally, when fabricating a semiconductor device, a deposition step, an etching step and a cleaning step are repeated many times in order to form a circuit pattern in multiple layers on a semiconductor wafer. This ultimately aims at high integration of a semiconductor device.

Figure 1A:
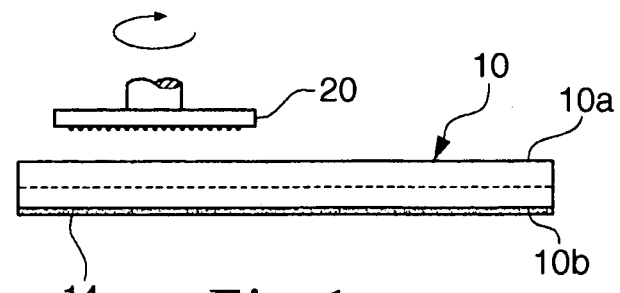
FIGS. 1a-1e are schematic sectional views showing an embodiment of a conventional method for manufacturing a semiconductor device successively.
Figure 1B:
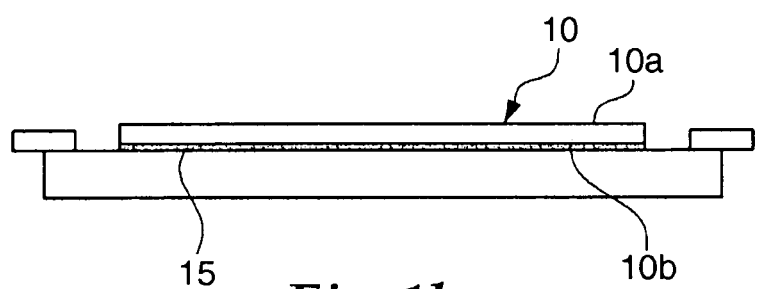
Figure 1C:
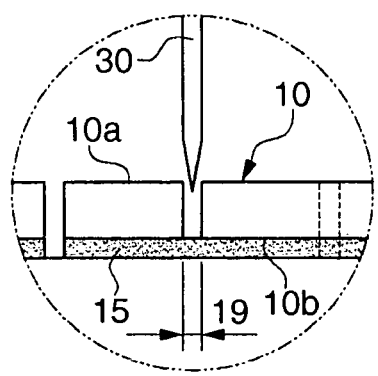
Figure 1D:
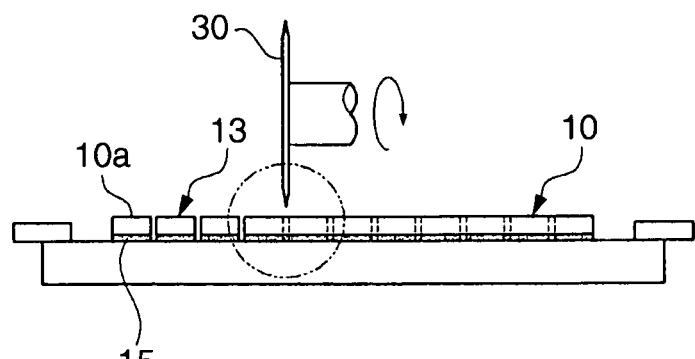
Figure 1E:
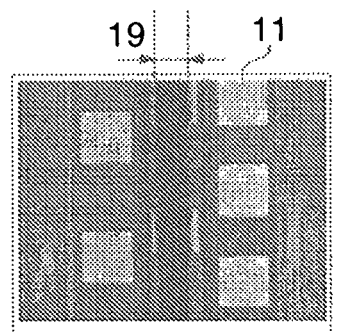
Figure 1F:
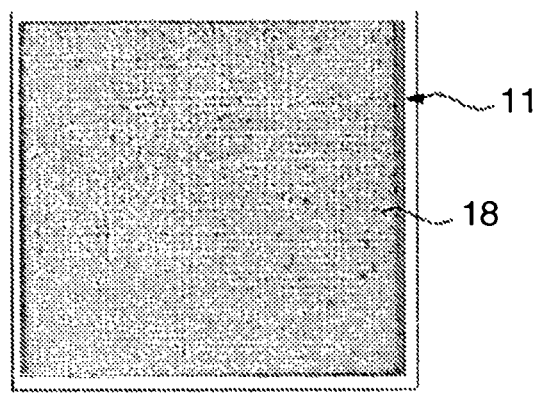
FIG. 1f is a top view showing how a bonding pad of a wafer is contaminated after dicing the wafer by the dicing method according to the prior art.
Figure 2A:
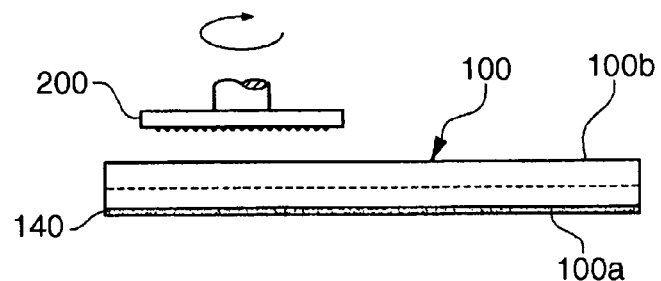
FIGS. 2a-2g are schematic sectional views showing an embodiment of a method for manufacturing a semiconductor device according to the present disclosure successively.

After forming a circuit pattern on one surface 100a of the wafer by way of the aforementioned wafer processing steps, a grinding step is performed to reduce the thickness of the semiconductor device, as shown in FIG. 2a. To the surface 100a, having the circuit pattern printed thereon, a tape 140 for back grinding is attached to protect the pattern. In the grinding step, the back surface 100b of the wafer 100, which has no circuit pattern, is removed by using a grinder 200.

Figure 2B:
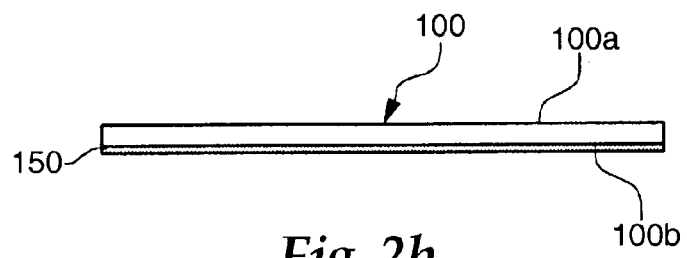

After performing the grinding step, the tape 140 for back grinding, attached to the surface 100a of the wafer 100 that has the circuit pattern formed thereon, is removed from the wafer 100 by way of UV irradiation. Then, as shown in FIG. 2b, a dicing tape 150 for carrying out a dicing step is attached to the back surface 100b of the wafer.

Figure 2C:
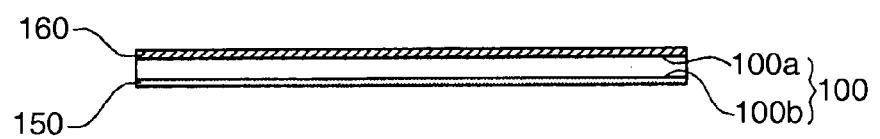

Then, a fluorine-containing polymer coating agent is applied onto the surface 100a of the wafer 100, which has the circuit pattern formed thereon, to form a fluorine-containing polymer coating layer 160, as shown in FIG. 2c.

The fluorine-containing polymer coating layer can be formed by a fluorine-containing polymer coating agent, which comprises a fluorine-containing compound and a solvent. The fluorine-containing polymer coating agent can be prepared by dispersing or dissolving the fluorine-containing polymer compound in a solvent.

It is desirable that the fluorine-containing coating agent according to the present disclosure does not undesirably chemically affect other elements of the wafer.

For example, such a fluorine-containing polymer compound may have the structure of a hydrocarbon-containing polymer, wherein hydrogen is substituted with fluorine. According to the embodiment of the present disclosure, the fluorine-containing polymer compound preferably has both a hydrophobic group and a hydrophilic group. The fluorine-containing polymer compound having both a hydrophobic group and a hydrophilic group may be a compound in which a main chain made of hydrocarbon or a fluorine-containing hydrocarbon has oxygen or nitrogen, or a compound in which a branched chain has an acidic group. The acidic group may be a groups such as a carboxylic acid (—COOH) or a sulfonic acid (—$SO_3H$).

The hydrocarbon or the fluorine-containing hydrocarbon acts as a hydrophobic group, and the oxygen, nitrogen or acidic group acts as a hydrophilic group.

According to the embodiment of the present disclosure, the fluorine-containing polymer compound preferably has 1,000-1,000,000 of molecular weight. A compound in solid state at room temperature can be used as the fluorine-containing polymer compound.

Although there is no limitation to types of the fluorine-containing polymer compound, the fluorine-containing polymer compound according to the embodiment of the present disclosure may be a compound represented by the formula of $C_aH_bF_cO_dS_eN_f$, wherein a is 10-10,000, b is 10-20,000, c is 10-20,000, d is 10-1,000, e is 0-100, and f is 0-1,000. According to the embodiment of the present disclosure, the fluorine-containing polymer compound is $C_aH_bF_cO_dS_e$, wherein a is 100-5,000, b is 200-10,000, c is 200-10,000, d is 30-1,000, and e is 0-100.

According to the embodiment of the present disclosure, the fluorine-containing polymer compound comprises 30 wt % or more of fluorine atoms based on the total weight of the compound, preferably 50 wt % or more of fluorine atoms.

The solvent for the fluorine-containing polymer coating agent may be a fluorine-containing solvent in liquid state at room temperature. Preferably, the solvent has a molecular weight, which is adjustable to maintain the liquid state at room temperature. For example, a fluorine-containing solvent having 100-800 of molecular weight may be used. The fluorine-containing solvent may be a solvent such as a fluorine-substituted ether, a fluorine-substituted ester or a fluorine-substituted ketone.

For example, the solvent may be represented by $C_kH_lF_mO_m$, wherein k is an integer of 3-15, l is an integer of 3-20, m is an integer of 3-20, and n is an integer of 1-3. For example, the solvent may be fluorine-substituted ether, fluorine-substituted ester, fluorine-substituted ketone, etc., which consists of one side represented by $C_xF_{2x+1}$ and the other side represented by $C_yH_{2y+1}$ based on —O—, —C=O or —COO, wherein x is preferably an integer of 2-3, and y is preferably an integer of 1-5.

To be more specific in one embodiment, the fluorine-containing solvent may be a compound represented by $C_nF_{2n+1}$—R—$C_mH_{2m+1}$, wherein R is O, C=O, or COO, n is an integer of 2-8, and m is an integer of 1-5, in particular, ether-containing compound represented by $C_nF_{2n+1}$—O—$C_mH_{2m+1}$, wherein n is an integer of 2-8, and m is an integer of 1-5.

According to the embodiment of the present disclosure, the fluorine-containing solvent may have 30 wt % or more of fluorine atoms based on the total weight of the solvent, preferably 50 wt % or more of fluorine atoms.

Products on sale, such as 3M™ Novec™ Engineered Fluid HFE-7100, may be used as the fluorine-containing solvent.

The fluorine-containing polymer coating agent according to the present disclosure can be prepared by dissolving or dispersing the fluorine-containing polymer compound. There is no limitation to the composition ratio of the solvent and the fluorine-containing polymer compound as long as the fluorine-containing polymer compound can be sufficiently dissolved or dispersed. Such a composition ratio may vary depending on the amount of the fluorine-containing polymer coating agent. According to the embodiment of the present disclosure, the fluorine-containing polymer coating agent can be prepared by use of a fluorine-containing polymer compound having about 0.1-10 parts by weight based on 100 parts by weight of the solvent. According to the embodiment of the present disclosure, the fluorine-containing polymer compound may have about 1 to 2 parts by weight based on 100 parts by weight of the fluorine-containing solvent, in consideration of the viscosity, drying rate, usability, etc. of the fluorine-containing polymer coating agent.

According to the embodiment of the present disclosure, the fluorine-containing polymer coating agent may have 30 wt % or more of fluorine atoms based on the total weight of the fluorine-containing polymer coating agent, preferably 50 wt % or more of fluorine atoms.

Commercially available products such as 3M™ Novec™ EGC-1700, may be used as the fluorine-containing polymer coating agent.

The polymer coating layer 160 formed by the fluorine-containing polymer coating agent causes passivation of the polymer. Therefore, it is possible to prevent silicon dust from depositing on the top surface of a die.

At this time, the fluorine-containing polymer coating layer 160 preferably has a thickness of about 0.1 μm-10 μm.

According to one exemplary embodiment of the present disclosure, the fluorine-containing polymer coating layer 160 has a thickness of about 1 μm, because the coating layer 160 should prevent the bonding pad 11 from being damaged by silicon dust generated during the dicing step.

Figure 2D:
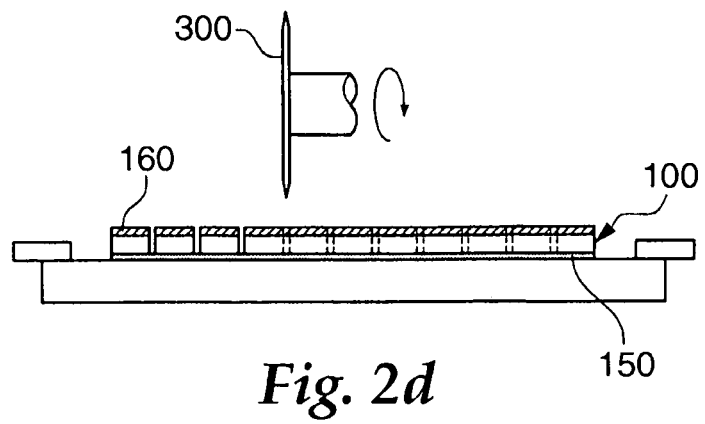

After forming the fluorine-containing polymer coating layer 160 on the surface 100a of the wafer 100, which has the circuit pattern formed thereon, the wafer 100 is subjected to a dicing process by cutting it along a strip line in order to separate individual dies, as shown in FIG. 2d.

For example, during the dicing process of the wafer 100, a blade 300 made of diamond may be used to cut the wafer 100.

Figure 2E:
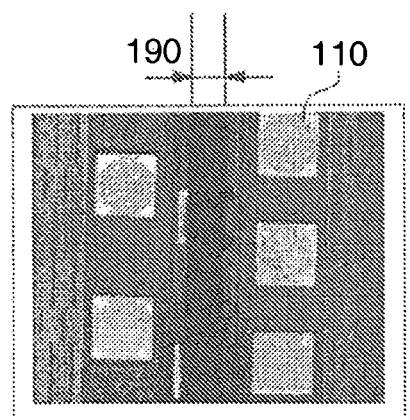

At this time, as shown in FIG. 2e, silicon dust, generated by the mechanical impact from the blade, sticks onto the bonding pad 110, particularly onto the top surface of the bonding pad, exposed on the outermost layer of the wafer.

However, according to one embodiment of the present disclosure, because the fluorine-containing polymer coating layer 160 is formed over the entire top surface of the wafer having the circuit pattern, the silicon dust 180 is not stuck directly onto the bonding pad 110.

Figure 2F:
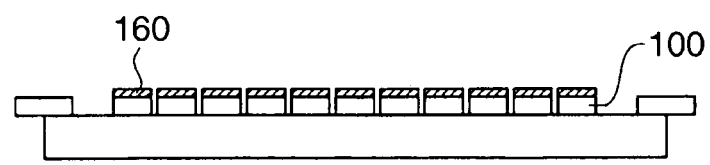
Figure 2G:
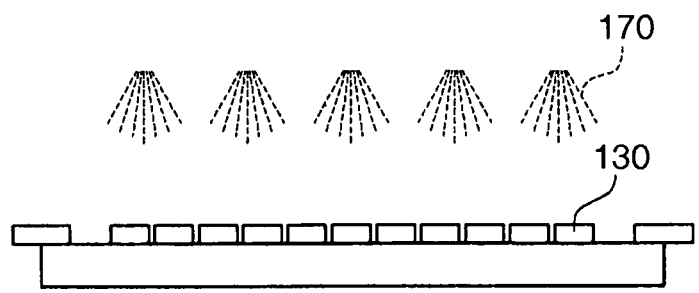

After that, as shown in FIG. 2f, the dicing tape is removed from the bottom surface 100a of the wafer. In order to remove the dicing tape, UV is irradiated onto the dicing tape so as to cure the adhesive of the dicing tape.

Subsequently, in order to remove the fluorine-containing polymer coating layer formed on the cut wafer 100, the decoating agent is applied in the step of removing the fluorine-containing polymer coating layer. For example, the decoating agent 170 is applied during a vapor degreasing or dipping process so as to remove the fluorine-containing polymer coating layer.

The vapor degreasing process, which is generally used in a semiconductor process, refers to a process of applying a solvent by exposing a wafer in vapor of the solvent so that the vapor of the solvent loses heat due to the difference in temperature of the solvent vapor and the wafer and is condensed on the surface of the wafer whereby contaminants adhered to the wafer are removed together with the condensed solvent.

In a variant, instead of the vapor degreasing process, it is possible to use a dipping process, wherein a wafer is dipped into a bath containing a decoating agent for about 1 minute to remove the fluorine-containing polymer coating layer and silicon dust from the top surface of the wafer.

The decoating agent 170 applied onto the wafer by way of a vapor degreasing or dipping process makes it possible to remove the fluorine-containing polymer coating layer 160, while separating the silicon dust that has stuck onto the fluorine-containing polymer coating layer from the wafer. Therefore, it is possible to reduce contamination of the bonding pad 110.

Preferably, then, the decoating solution 170 does not undesirably chemically affect the other structure of the wafer including a bonding pad 110 and polymer of the wafer 100, etc.

The fluorine-containing solvent, which is used when preparing the fluorine-containing polymer coating agent, may be used as the decoating agent used for removing the fluorine-containing polymer coating layer.

The fluorine-containing solvent, which may be used as the decoating agent, may be the same as or different from the fluorine-containing solvent, which is used when preparing the fluorine-containing polymer coating agent. The fluorine-containing solvent, which is used as the decoating agent, may be the fluorine-containing solvent in liquid state at room temperature. The fluorine-containing solvent may have a molecular weight sufficient to maintain the liquid state at room temperature, for example, approximately 100-800. The fluorine-containing solvent, which may be used as the decoating agent, includes but is not limited to fluorine-substituted ether, fluorine-substituted ester, fluorine-substituted ketone, etc.

For example, such a decoating agent may be represented by $C_kH_lF_mO_n$, wherein k is an integer of 3-15, l is an integer of 3-20, m is an integer of 3-20, n is an integer of 1-3. For example, the decoating agent may be fluorine-substituted ether, fluorine-substituted ester, fluorine-substituted ketone, etc., which has one side represented by $C_xF_{2x+1}$ and the other side represented by $C_yH_{2y+1}$ based on —O—, —C=O or —COO, wherein x is an integer of 2-3, and y is an integer of 1-5. According to the embodiment of the present disclosure, the fluorine-containing solvent, which is used as the decoating agent, may have 30 wt % or more of fluorine atoms based on the total weight percent of the solvent, preferably 50 wt % or more of fluorine atoms.

Commercially available products such as 3M™ Novec™ Engineered Fluid HFE-7100, may be used as the decoating agent.

Figure 2H:
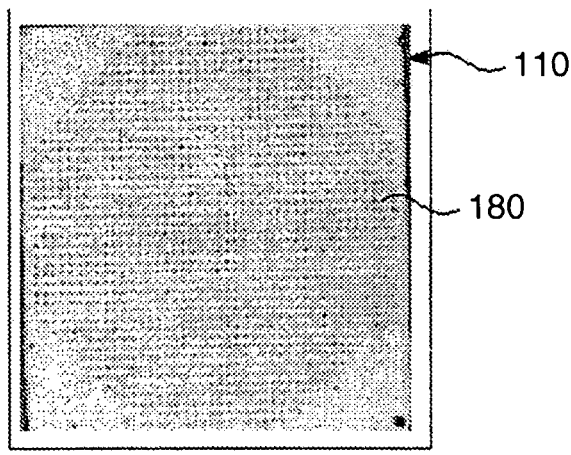
FIG. 2h is a top view showing how a bonding pad of a wafer is contaminated after dicing the wafer by the dicing method according to the present disclosure.

As can be seen from FIG. 2h, since the fluorine-containing polymer coating layer is formed on the bonding pad 110 before carrying out the dicing process according to the present disclosure, it is possible to reduce contamination of the bonding pad with the silicon dust 180.

Then, the die 130, separated individually as described above, is mounted to a printed circuit board or a lead frame, and wire bonding is performed to make electric connection between the die and the printed circuit board or a lead frame.

At this time, the bonding pad 110 of the semiconductor device is generally formed of Al, or alloys thereof such as Al/Cu or Al/Cu/Si. In this case, when Au wires are adhered to the bonding pad formed of Al or Al alloys, an intermetallic compound ($AuAl_2$) is produced with ease, thereby resulting in very high efficiency in wire bonding.

As described above, according to the prior art, deionized water mixed with carbon dioxide ($CO_2$) is sprayed onto the wafer to remove the silicon dust present on the wafer. However, when fabricating a semiconductor device according to the present disclosure, a surface of the semiconductor device, which has a circuit pattern formed thereon, is protected with a fluorine-containing polymer coating layer that does not chemically affect the wafer surface, so as to prevent the bonding pad from being corroded. As a result, a bonding step becomes easy in a bonding pad, bonding efficiency increases and bonding defect decreases.

The method for dicing a semiconductor wafer according to the present disclosure can reduce a failure in the subsequent wire bonding step and can ensure the electrical reliability of the semiconductor device.

EXAMPLE 1

Hereinafter, the method for dicing a semiconductor device according to a preferred embodiment of the present disclosure will be explained.

In this example, a wafer 100 having a diameter of about 8 inches was used. After a dicing tape 150 was attached to the back surface 100b of the wafer 100, the wafer was dipped into a coating agent, 3M™ Novec™ EGC-1700, to form a fluorine-containing polymer coating layer 160 on the wafer, and then the wafer was drawn out in the vertical direction while maintaining a constant speed. A fluorine-containing polymer coating layer was formed on the surface of the wafer 100 (see e.g., FIG. 2a). On the other hand, a fluorine-containing polymer coating layer may be formed by way of a spin coating process (S1).

Next, a dicing process was carried out by using a blade 300 along a strip line 190 formed between one die 130 and another die 130 (S2).

After the completion of the dicing step, the coated wafer was subjected to a vapor degreasing process using a decoating solvent, 3M™ Novec™ Engineered Fluid HFE-7100, to remove the coating layer simultaneously with silicon dust (S3).

Then, the dicing tape 150, attached to the back surface 100b of the wafer 100, was removed by way of UV irradiation, and the individually separated die 130 was mounted onto a printed circuit board or a lead frame, and then wire bonding was carried out to make electric connection (S4).

Additionally, the die and the printed circuit board or the lead frame was encapsulated with an epoxy molding material to seal the bonding portion. Then, the resultant product was cut into an individual unit to provide a semiconductor device (S5).

While this disclosure has been described in connection with what is presently considered to be the most practical and preferred embodiment, it is to be understood that the disclosure is not limited to the disclosed embodiment and the drawings. On the contrary, it is intended to cover various modifications and variations within the spirit and scope of the appended claims.

Industrial Applicability

As can be seen from the foregoing, it is possible to prevent a wafer from being contaminated with silicon dust during a dicing process for cutting a wafer, according to the present disclosure.

According to various embodiments of the present disclosure, it is possible to effectively prevent a die from being contaminated with silicon dust, and thus to prevent contamination of a sensor surface and surface damage caused by the silicon dust, resulting in an increase in the yield of a semiconductor package manufacturing process. In addition, according to the present disclosure, it is possible to solve the problem related to a failure in wire bonding and to prevent corrosion of metal wires in a semiconductor device by using a fluorine-containing polymer coating layer. Therefore, it is possible to improve the reliability and yield of a semiconductor device.

The invention claimed is:

1. A method for manufacturing a semiconductor die, which comprises:
    forming a fluorine-containing polymer coating layer on a surface of a semiconductor wafer;
    dicing the semiconductor wafer; and
    removing the fluorine-containing polymer coating layer.

2. The method according to claim 1, wherein the fluorine-containing polymer coating layer has a thickness of about 0.1μm-10μm.

3. The method according to claim 1, wherein removing the fluorine-containing polymer coating layer further comprises the steps of:
    applying a decoating agent comprising of a fluorine-containing solvent; and
    cleaning the semiconductor wafer.

4. The method according to claim 3, wherein applying the decoating agent on the fluorine-containing coating layer is conducted through a vapor degreasing process or a dipping process.

5. The method according to claim 3, wherein the decoating agent is a fluorine-containing solvent having about 100-800 molecular weight.

6. The method according to claim 3, wherein the decoating agent is fluorine-substituted ether, fluorine-substituted ester or fluorine-substituted ketone.

7. The method according to claim 3, wherein the decoating agent is a compound represented by $C_nF_{2n+1}-R-C_mH_{2m+1}$,
    wherein R is O, C=O or COO,
    n is an integer of 2-8, and
    m is an integer of 1-5.

8. The method according to claim 3, wherein the decoating agent is a compound having 30 wt % or more of fluorine atoms based on the total weight of the decoating agent.

9. The method according to claim 1, wherein the fluorine-containing polymer coating layer is formed by a fluorine-containing polymer coating agent comprising a fluorine-containing polymer compound and a solvent.

10. The method according to claim 9, wherein the fluorine-containing polymer compound has both a hydrophobic group and a hydrophilic group.

11. The method according to claim 9, wherein the fluorine-containing polymer compound has 1,000-1,000,000 of molecular weight.

12. The method according to claim 9, wherein the fluorine-containing polymer compound is represented by $C_aH_bF_cO_dS_eN_f$, wherein a is 10-10,000, b is 10-20,000, c is 10-20,000, d is 10-1,000, e is 0-100, and f is 0-1,000.

13. The method according to claim 9, wherein the fluorine-containing polymer compound comprises 30 wt % or more of fluorine atoms based on the total weight of the compound.

14. The method according to claim 9, wherein the fluorine-containing coating agent comprises about 0.1-50 parts by weight of the fluorine-containing polymer compound based on 100 parts by weight of the solvent.

15. The method according to claim 9, wherein the fluorine-containing coating agent comprises 30 wt % or more of fluorine atoms based on the total weight of the agent.

16. The method according to claim 9, wherein the solvent is a fluorine-containing solvent having a molecular weight of about 100-800.

17. The method according to claim 16, wherein the fluorine-containing solvent is fluorine-substituted ether, fluorine-substituted ester or fluorine-substituted ketone.

18. The method according to claim 16, wherein the fluorine-containing solvent is a compound represented by $C_kF_{2n+1}-R-C_mH_{2m+1}$,
    wherein R is O, C=O or COO,
    n is an integer of 2-8, and
    m is an integer of 1-5.

19. The method according to claim 16, wherein the fluorine-containing solvent is a compound comprising 30 wt % or more of fluorine atoms based on the total weight of the compound.

* * * * *